United States Patent
Kumar

(10) Patent No.: US 11,017,858 B1
(45) Date of Patent: May 25, 2021

(54) LOW POWER CONTENT ADDRESSABLE MEMORY

(71) Applicant: Sudarshan Kumar, Fremont, CA (US)

(72) Inventor: Sudarshan Kumar, Fremont, CA (US)

( * ) Notice: Subject to any disclaimer, the term of this patent is extended or adjusted under 35 U.S.C. 154(b) by 0 days.

(21) Appl. No.: 15/390,500

(22) Filed: Dec. 25, 2016

Related U.S. Application Data

(60) Provisional application No. 62/387,328, filed on Dec. 29, 2015.

(51) Int. Cl.
*G11C 15/04* (2006.01)

(52) U.S. Cl.
CPC .................... *G11C 15/04* (2013.01)

(58) Field of Classification Search
CPC ....................................................... G11C 15/04
USPC ....................................................... 365/49.17
See application file for complete search history.

(56) References Cited

U.S. PATENT DOCUMENTS

| | | | | |
|---|---|---|---|---|
| 5,319,590 A * | 6/1994 | Montoye | ............... | G11C 15/04 365/189.07 |
| 5,930,359 A * | 7/1999 | Kempke | ............... | G11C 15/00 365/49.17 |
| 6,195,279 B1 * | 2/2001 | Townley | ............... | G11C 15/04 365/189.07 |
| 7,286,379 B1 * | 10/2007 | Sun | ............... | G11C 15/04 365/189.07 |
| 7,685,480 B1 * | 3/2010 | Fuh | ............... | G11C 15/00 714/718 |
| 2002/0070775 A1 * | 6/2002 | Chiu | ............... | G06F 17/5031 327/141 |
| 2003/0156440 A1 * | 8/2003 | Hata | ............... | G11C 15/00 365/49.17 |
| 2012/0206166 A1 * | 8/2012 | Potvin | ............... | H03K 3/0375 327/18 |

* cited by examiner

*Primary Examiner* — Jay W. Radke
(74) *Attorney, Agent, or Firm* — Haynes and Boone, LLP; Philip H. Albert

(57) ABSTRACT

A CAM/TCAM includes a plurality of rows of CAM/TCAM lines, a plurality of search lines, and a plurality of bit lines, wherein each row comprises an array of CAM/TCAM cells. Each TCAM cell has two storage cells, representing state for data and a mask of the cell, and match logic. The two storage cells connect to a respective bit line as input and their output drives the match logic. In response to the respective search line and storage outputs, the match logic generates cell match outputs. The match logic can be implemented using static logic comprising tristate gates and masking logic that forces the cell match output to a predetermined value in response to the stored mask value. The match outputs in the row are AND-ed by a logic tree to generate a match output, thereby reducing power consumption.

16 Claims, 7 Drawing Sheets

| (A1, A2) | S | SN | M[i] | Meaning |
|---|---|---|---|---|
| (0, 1) | 0 | 1 | 1 | TCAM data bit and search bit are both "0" |
| (0, 1) | 1 | 0 | 0 | TCAM data bit="0" but search bit="1" |
| (1, 0) | 0 | 1 | 0 | TCAM data bit="1" but search bit="0" |
| (1, 0) | 1 | 0 | 1 | TCAM data bit and search bit are both "1" |
| (0, 0) | 0 | 1 | 1 | Masked, so M[i]=1 regardless of the value of S |
| (0, 0) | 1 | 0 | 1 | Masked, so M[i]=1 regardless of the value of S |
| (1, 1) | — | — | — | (not used; does not occur) |

US 11,017,858 B1

LOW POWER CONTENT ADDRESSABLE MEMORY

CROSS-REFERENCES TO PRIORITY AND RELATED APPLICATIONS

This application claims the benefit of U.S. Provisional Patent Application No. 62/387,328, filed Dec. 29, 2015, entitled "Low Power Content Addressable Memory."

FIELD OF THE INVENTION

The present invention relates to memory circuits generally, and more particularly to low-power content addressable memory (CAM).

BACKGROUND

In every generation, the amount of memory needed by systems goes up. As a result, there is lots of memory in any system. Some memories are standalone memories while other memories are embedded in other devices. Out of these memories, some are content addressable memory (CAM), which is used for very fast table lookup. CAM is also called associative memory, where this type of memory is addressed by the data it holds. Another type of CAM is ternary CAM (TCAM). For each bit of data stored in TCAM, it also holds mask bit which, when set, generates/forces a match for that bit. TCAM requires twice the number of storage latches to store both data and its mask. In the case of CAM and TCAM, much power is consumed as all the searches are done in parallel. In networking, the TCAM sizes are in several megabits and hence power consumed by these TCAMs is a significant portion of power consumed in integrated circuits using these TCAMs.

The present invention helps solve the power problem in CAM and TCAM without sacrificing speed or area.

BRIEF DESCRIPTION OF THE DRAWINGS

The present invention is illustrated by the way of example and not by way of limitation, in the figures of the accompanying drawings.

DETAILED DESCRIPTION

The following disclosure describes low-power CAMs and TCAMs. In the following example, very simplified examples and operations are described in order to provide a thorough understanding of the present invention. In some instances, details have been omitted in order not to obscure the invention. It will be appreciated by one skilled in the art that the invention can be practiced in other ways without details described here.

CAMs and TCAMs are well known and are described in textbooks and publications, so some details are avoided here in order to focus on present innovation.

Figure 1A:
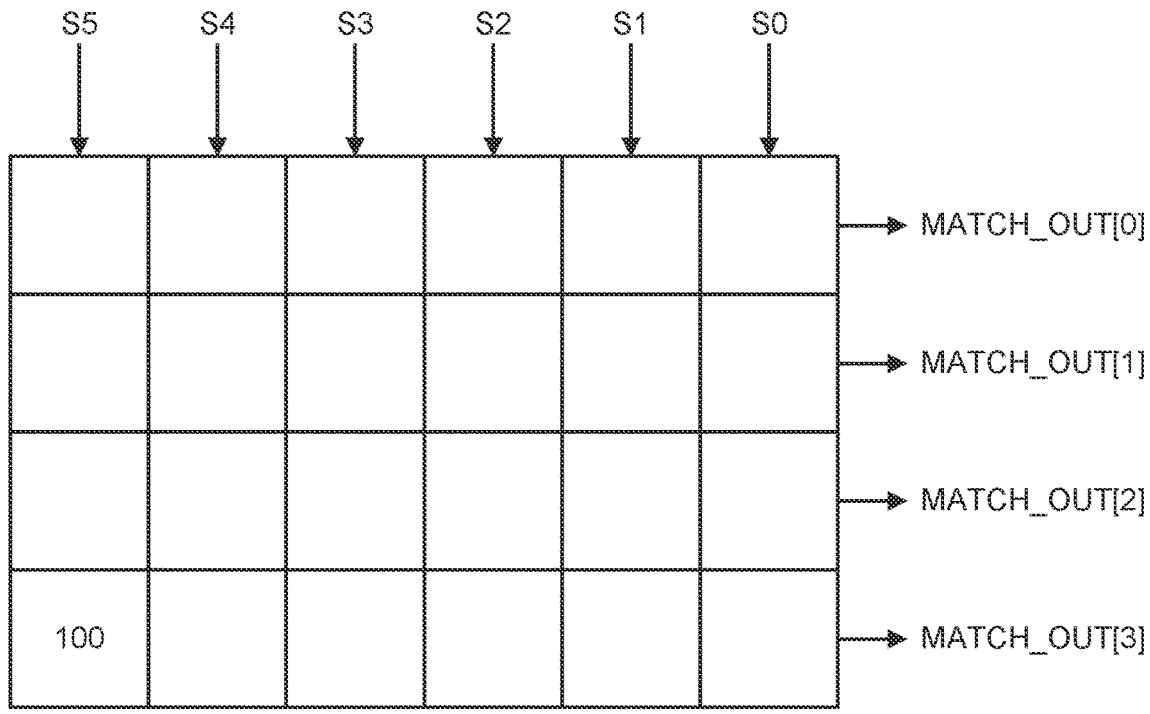
FIG. 1A shows general row/column structure of a CAM or a TCAM of the prior art.

A simplified block diagram in FIG. 1A shows a row and column structure 100 of a CAM/TCAM. Data to be searched are stored in rows. The column indicates a width of the stored data. The number of rows indicates the number of data items that are stored in the CAM/TCAM to be searched. In this example, six bits of search data (S5 through S0) are used to search this example CAM/TCAM. If a match is found in row i, the corresponding MATCH_OUT[i] line is turned on.

Figure 1B:
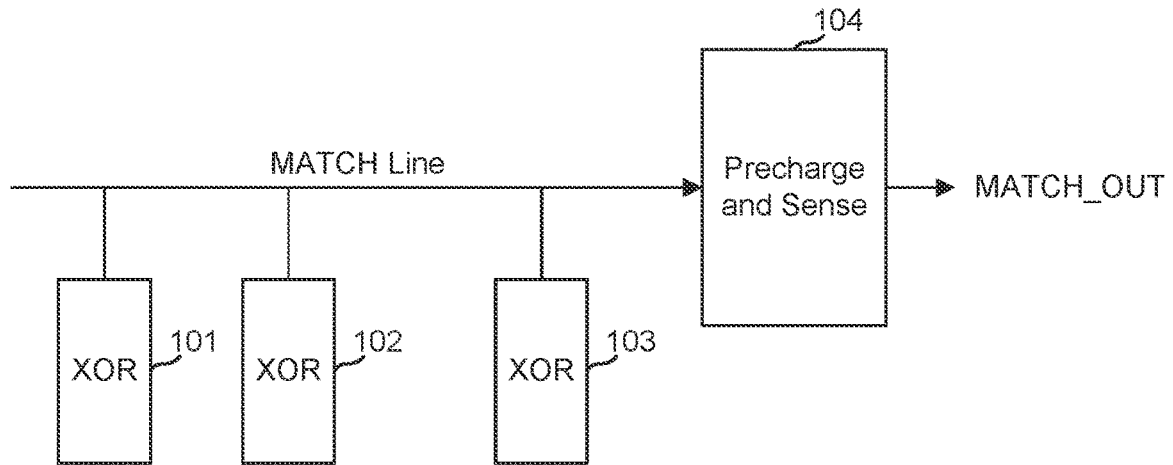
FIG. 1B is a block diagram of a CAM/TCAM memory row of the prior art.

A simplified block diagram of a row of typical CAM/TCAM match logic is shown in FIG. 1B. For speed and area reasons, domino (precharged and discharge) circuits are used for implementation. Search data is the data that is being searched in the CAM/TCAM. Each bit of search data is compared with corresponding bits for each row bit cell using XOR cells 101, 102, . . . , 103, containing only pulldown XOR logic. The output of each XOR cell is connected to a MATCH line, which is precharged in a precharge phase of a clock. In an evaluation phase of the clock, each XOR with a mismatch will discharge MATCH lines. Since a match typically happens in only one row of the CAM/TCAM, only one matching row will not have its MATCH line discharged. For all other rows, the MATCH lines are discharged. As a result, with the MATCH lines in every row precharging and discharging every clock cycle, there is a huge amount of power consumption.

The MATCH line is highly loaded, as all the XOR cells in that row connected to the MATCH line. As a result, the MATCH lines transition very slowly and add to a CAM/TCAM lookup delay. To speed up the lookup, a sense amplifier 104 is used to detect a value of the MATCH line and the output of the sense amplifier 104 is the MATCH_OUT line. In addition to a sense amplifier, many other techniques are used to improve speed as well as reduce power and area. Having precharge discharge circuits for finding matches, a domino CAM/TCAM's power consumption is very high. One way to reduce power is to use static gates for comparison and a match operation where switching activities on nodes are much lower as the nodes need not be precharged and discharged every cycle.

Figure 2:
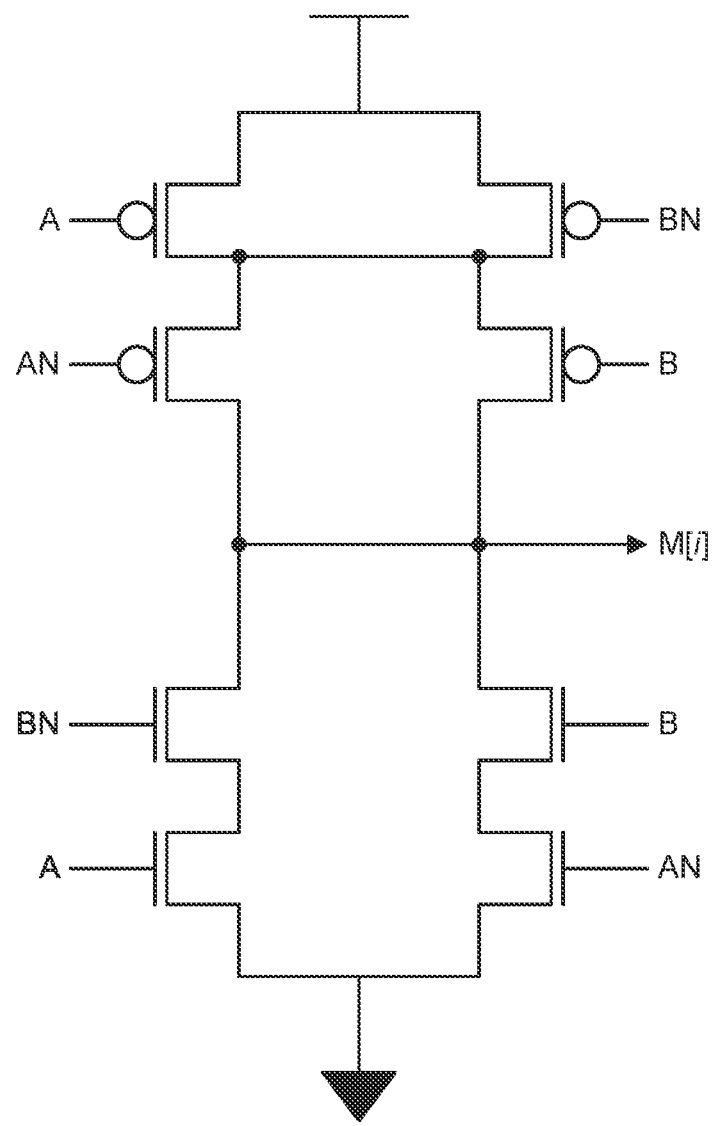
FIG. 2 is a schematic diagram of a prior art XNOR gate used in a CAM/TCAM.

For low-power static implementations, typically the static XNOR gates of FIG. 2 are used. It is to be noted that the same static gate in FIG. 3 can be used as the XOR gate by switching inputs. Since the gates are connected such that they provide the XNOR function, they are sometimes called XNOR gates. The output of these static XNORs for a whole row are combined together to generate a match result for that row. Done appropriately, this implementation saves power but adds a huge delay and area penalty.

The MATCH line that was a wired OR gate in the prior art domino implementation of FIG. 1B is now made of several stages of logic. The XNOR gate is full CMOS, hence it has eight CMOS transistors as compared to that of the prior art in FIG. 1B, which has pulldown XNOR logic made of four NMOS (n-channel metal-oxide semiconductor) transistors. Using full CMOS XNOR logic combined with multistage combining logic increases the area used and increases delays. Embodiments of the present invention solve the area issue and the delay issue by using an alternative XNOR implementation and efficient implementation of the combining logic to generate match signals.

Figure 3:
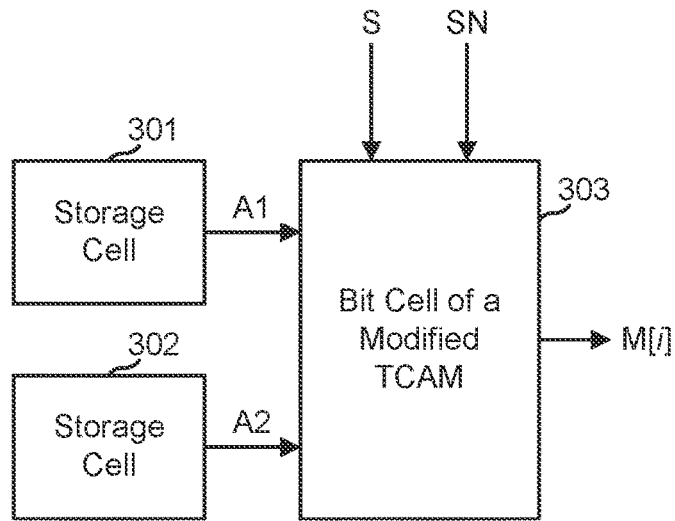
FIG. 3 is a block diagram of a bit cell of a modified TCAM.

Here, most of the discussion will be focus on TCAM rather than CAM as the CAM function is a subset of the TCAM function. FIG. 3 shows one bit of TCAM. Two storage cells 301 and 302 are used to store a data bit and a mask bit. Cell 303 in FIG. 3 implements a compare function (XOR or XNOR) with a mask function. There are different ways to store these two bits in these two storage cells 301 and 302. One popular way is to store them as encoded bits as shown in table in FIG. 3.

Figure 4:
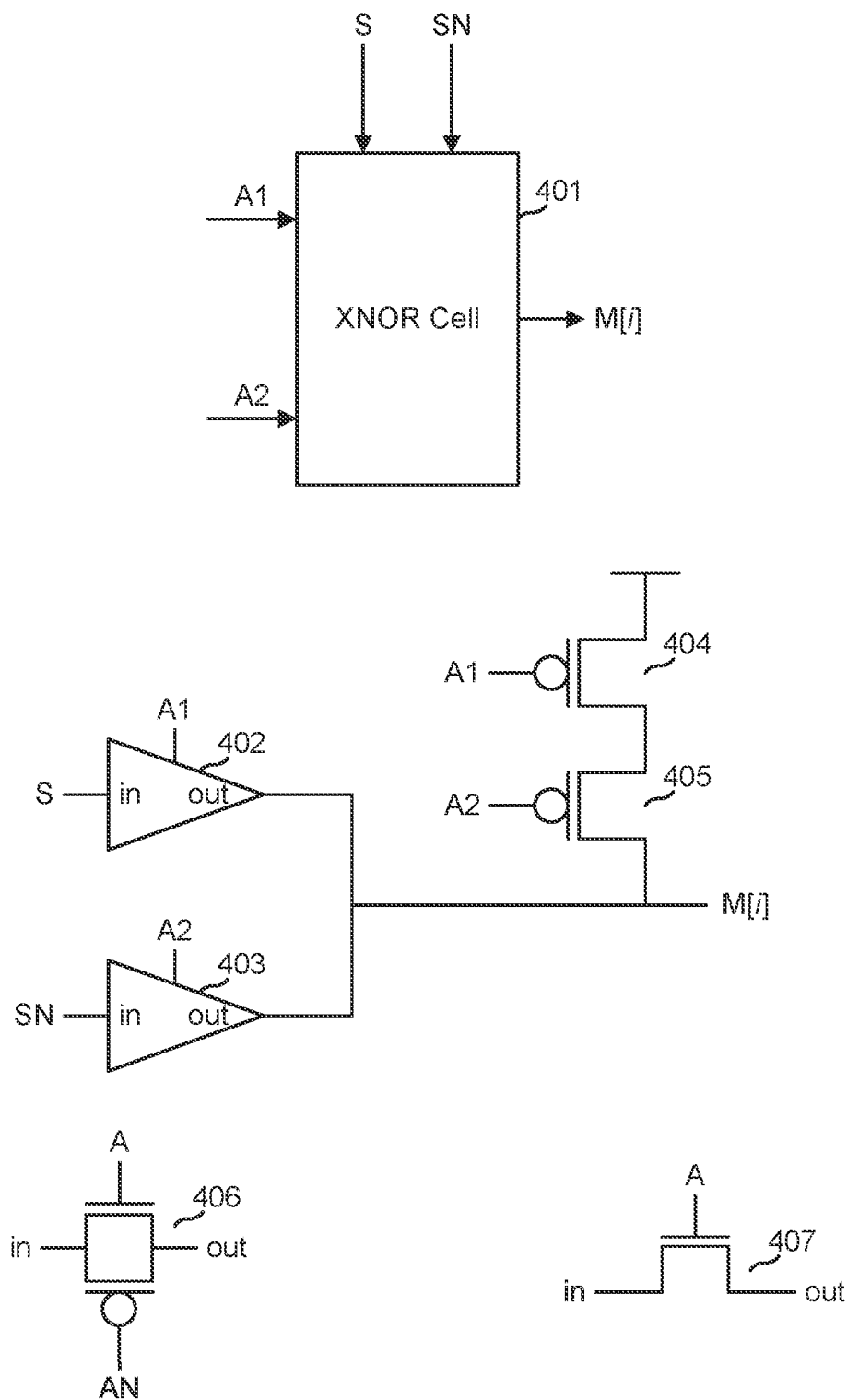
FIG. 4 is a low-power implementation of an XNOR cell used in a modified TCAM.

An advantage of encoded bits is that the XOR/XNOR logic with a mask function is easy to implement with fewer transistors. An XNOR cell 401 in FIG. 4 functions the same as the XNOR cell 303 in FIG. 3. This XNOR cell 401 is implemented as two tristate gates 402 and 403 and masking logic comprising two PMOS (p-channel metal-oxide semiconductor) transistors 404 and 405. When a mask for that TCAM cell is set, in the encoded scheme, both A1 and A2 have a "0" value as per the encoding table of FIG. 3. As a result, tristate gates 402 and 403 are off and PMOS transistors 404 and 405 are on, which forces M[i] to high with logical value of "1." It will be appreciated by one skilled in the art that by changing the encoding scheme and the switching input to a tristate gate, the masking logic can be implemented using two NMOS transistors that will force the output low when masking. In this case of an alternative encoding scheme, the output is active low and is the inverse of output M[i] in FIG. 4. In order to reduce area, power and delay, tristate gate 402 and 403 are each implemented as passgates, such as passgate 406, comprising PMOS and NMOS transistors. In FIG. 4, the AN signal is the inverse of the A signal, which is readily available from the storage cell and hence need not be generated again locally using an inverter.

Using passgates, XNOR cell 401 can be implemented using six transistors as compared to eight transistors in the circuit of FIG. 2. The power consumption of this XNOR cell 401 is very low and the delay of the passgate is low. Passgate 406 need not have both PMOS and NMOS transistors. It can be made with only one transistor. In one implementation, it can be made of only NMOS transistors, such as transistor 407 shown in FIG. 4. Even though output M[i] may not reach the full rail high voltage, the rest of the combining logic can work at a lower voltage level, thereby reducing power further. Even search data S and SN can have a lower high voltage so that there is less power consumption. By using only one transistor 407 as a passgate, the total number of transistors to implement XNOR cell 401 is four, which is same number of transistors for the XOR used in a domino implementation.

Although a TCAM can implement the CAM function, the CAM function requires fewer transistors to implement, as it does not have to deal with masking. It requires only one storage cell to store data, as it need not store a masking bit. It also does not need masking logic implemented using transistors 404 and 405 as used in FIG. 4. The rest of the logic and implementations are same as for TCAM. There is match if all the bits in a row match. That means that the bit match signal M[i] is high in all the TCAM cells in that row. To get match signals, all M[i] outputs of the TCAM cells are combined using AND-ing or NAND-ing logic to detect an "all high on M[i]" signal of each of the TCAM cells, as shown in FIG. 5A.

Figure 5A:
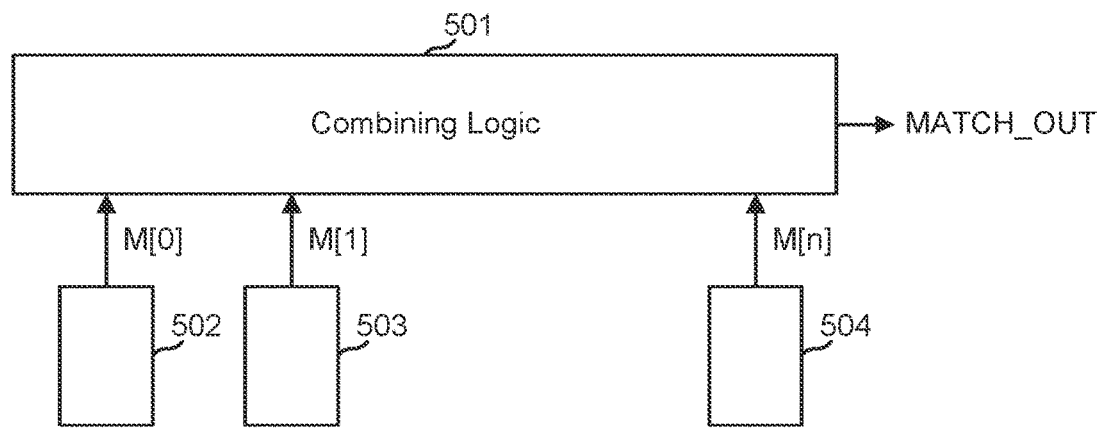
FIG. 5A is a block diagram of a row of CAM/TCAM.

In FIG. 5A, all the M[i] outputs, from M[0] to M[n] of individual TCAM cells 502, 503, . . . , 504, are fed into combining logic 501 to generate a MATCH_OUT output of that row. Combining logic 501 may use other inputs, such as a row valid bit (not shown). While there are various ways to implement this NAND-ing or AND-ing operation, one preferred implementation is shown in FIG. 5B.

Figure 5B:
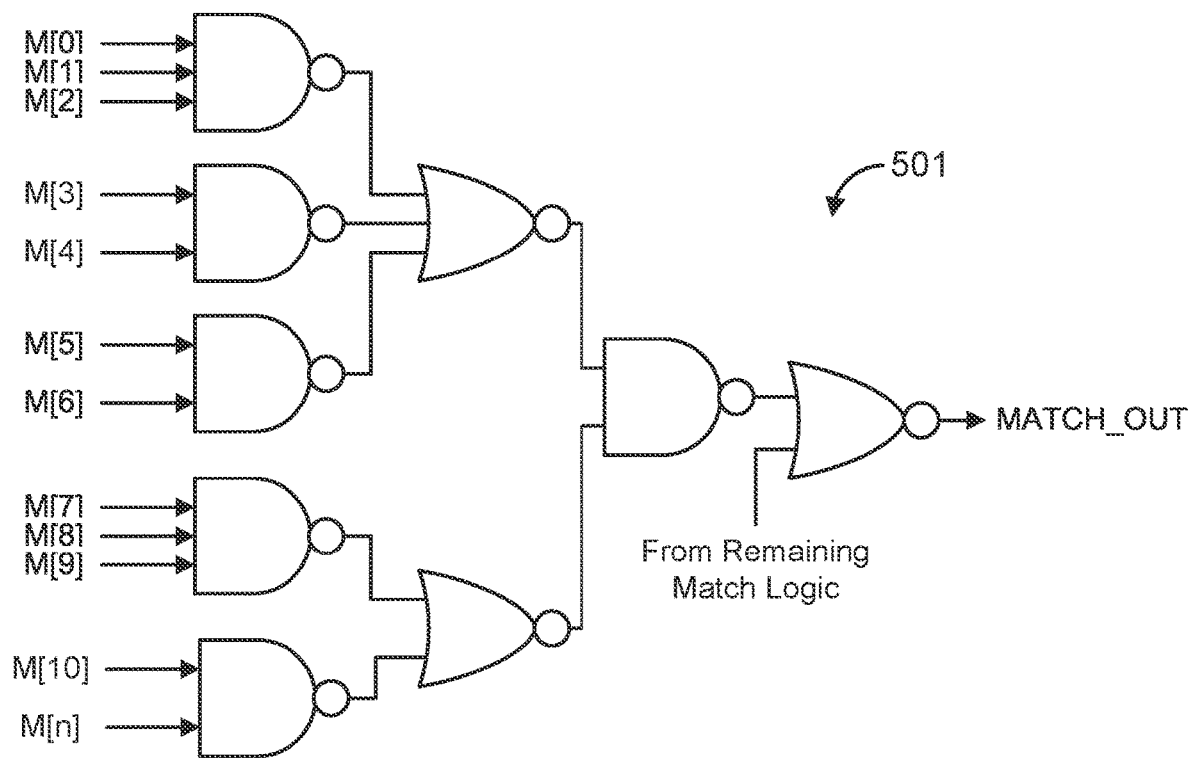
FIG. 5B is an example schematic of ANDING logic.

In FIG. 5B, alternate rows of NAND gates and NOR gates are used to combine all M[i] outputs of each TCAM cell of a row to generate the MATCH_OUT output. A goal here is to combine all M[i] outputs using fewer levels of logic, to reduce the delay in the combining logic. It is important to notice that switching activity goes down with the number of levels. Also, an output of a three-input NAND gate has less switching activity as compared to a two-input NAND gate. So in order to reduce power, the first level NAND gates should have more inputs, if possible.

Note that if the M[i] signal TCAM bit is implemented with low logic, then NOR-ing or OR-ing functions might be used as the combining logic to detect a match. In FIG. 5B, the first row has NOR gates followed by alternating rows of NAND and NOR gates.

Typically TCAM match array evaluation uses many logic gates as well as having RC delays and so may not work at the desired frequency. To improve the clock frequency, TCAM blocks can borrow time from a next block in pipeline. The next block is usually a priority encoder, which is a lot faster. This is accomplished by delaying a clock of output transitions of a TCAM such that TCAM match logic has more than a clock period to evaluate.

Figure 6A:
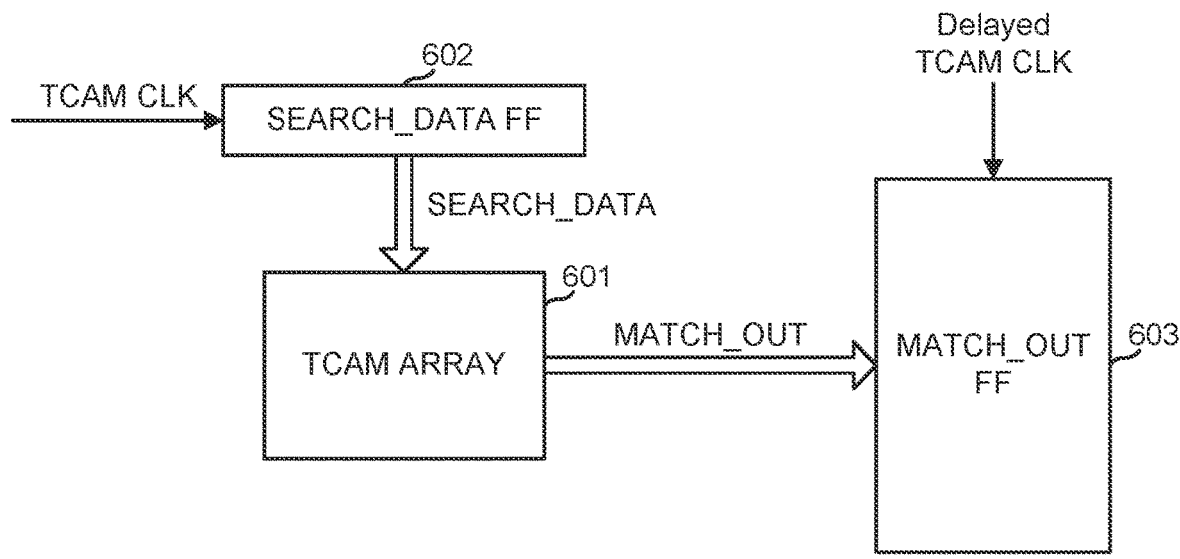
FIG. 6A is block diagram of a TCAM array with input and output flip-flops.

FIG. 6A shows a TCAM array 601 with an input flip-flop block 602 driving SEARCH_DATA which goes as the input to TCAM array 601. The output MATCH_OUT gets flopped by an output flip-flop block 603. Normally both input the input flip-flop block 602 and the output flip-flop block 603 are clocked by clocks having the same period and typically are derived from the same source clock. In this case, the total delay is the sum of the output delay (clk to output) of the input flip-flop block 602, a TCAM array delay and a setup delay of the output flip-flop block 603, and the total delay must be less than a clock period. If this condition is not satisfied, then TCAM will not produce the correct result and the operating clock frequency must be decreased.

Figure 6B:
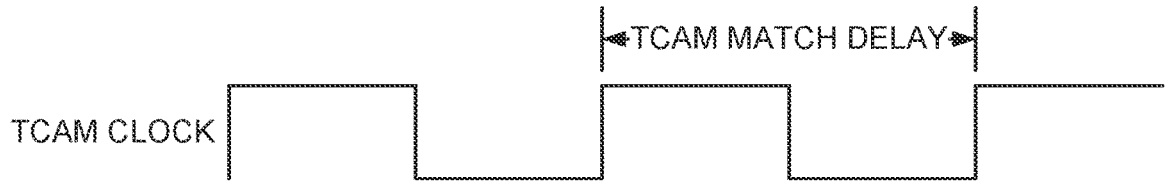
FIG. 6B is clock waveform for a normal clocking scheme.
Figure 6C:
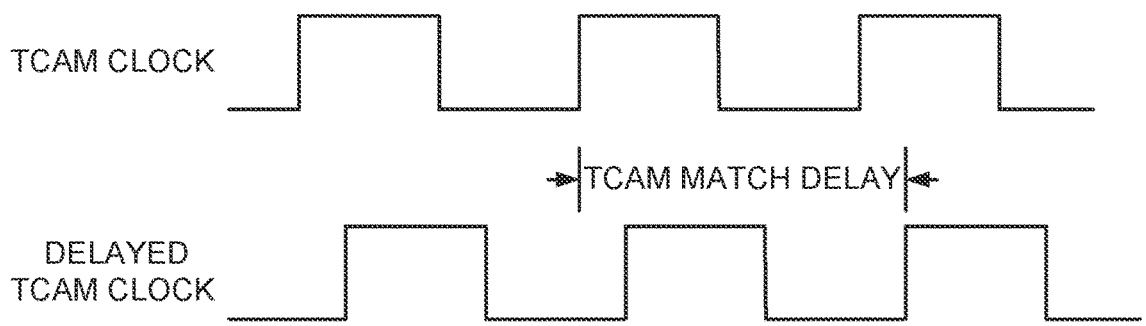
FIG. 6C is clock waveform for a new clocking scheme.

FIG. 6B shows that the TCAM clock frequency is limited by the TCAM match delay. As shown in FIG. 6C, the clock of the output flip-flop block 603 receiving these match signals is delayed considerably so that the match evaluation has more time than a clock period and hence the TCAM can work at a higher clock frequency and is not limited by the TCAM array delay, which is more than a clock period. This innovation can be used in other types of designs, such as memory and logic blocks, data path and control to get these blocks to operate at higher frequencies and is not limited by inherent delays of these blocks.

Figure 7A:
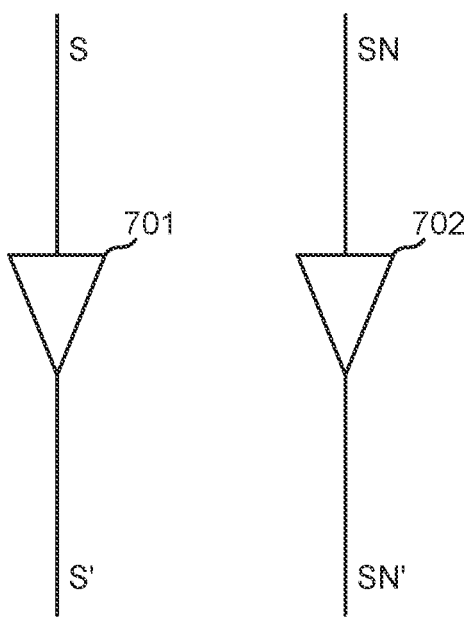
FIG. 7A is illustrates a buffering scheme using a buffer.
Figure 7B:
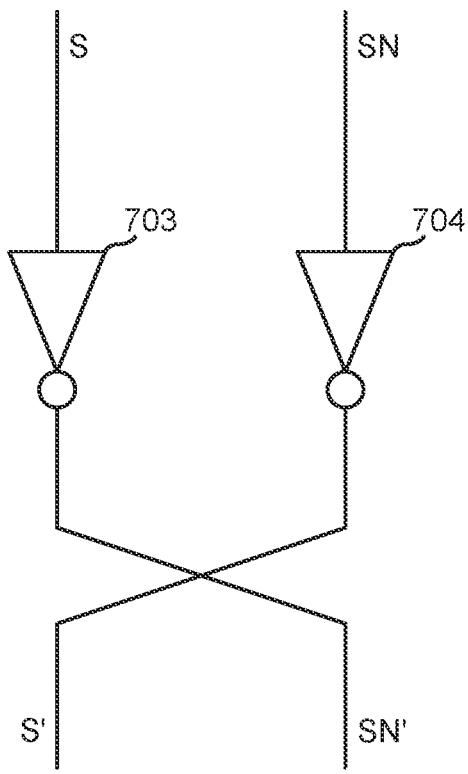
FIG. 7B is illustrates a buffering scheme using inverting logic.

Search data goes through each row of the TCAM and hence they have long lines with large RC delays. In order to reduce the RC delay, search data lines are broken into segments as in, for example, FIG. 7A. In FIG. 7A, S is broken in two segments and the second S segment is driven by a buffer 701. This reduces the RC delay on search line S. There can be multiple stages of buffering. Similarly, a complement, SN, of search data S is also buffered by buffer 702 in order to reduce the RC delay. Typically, a buffer comprises at least two inverting gates. This has more delay as compared to the scheme of the example shown in FIG. 7B, where only one inverting stage 703 and 704 are used to buffer. Hence, the buffering scheme in FIG. 7B is faster than the buffering scheme in FIG. 7A.

An issue with implementation with static gates is power modeling of the TCAM/CAM. In the case of a domino implementation, all internal power consumption is assigned to a clock as all nodes precharge and discharge with the clock and consume about the same amount of power. In the case of static implementation, power consumption depends on activity of internal nodes of search lines, match logic of the TCAM/CAM cell and the combining logic of the TCAM/CAM row. In an embodiment of the present invention, power is modeled as a function of switching activity on search inputs and the flopped version of search inputs that goes to all the TCAM cells. This way power gets modeled correctly. This concept can be used in other types of static memory and static logic blocks as well.

In the foregoing specification, the invention has been described with reference to specific exemplary embodiments thereof. It will, however, be evident that various modifications and changes may be made thereto without departing from the broader spirit and scope of this invention. The drawings are accordingly to be regarded in an illustrative rather than a restrictive sense.

What is claimed is:

1. A ternary content addressable memory (TCAM) comprising:
    a plurality of TCAM cells, each capable of storing a bit value and organized into rows of TCAM cells with each row having a number of TCAM cells wherein the number of TCAM cells corresponds to a width of stored data, and wherein each row, of the rows of TCAM cells, represents one stored entry in a content of the TCAM;
    a plurality of match circuits, wherein a given match circuit of the plurality of match circuits corresponds to a corresponding row of the rows of TCAM cells; and
    a plurality of search inputs,
    wherein a TCAM cell comprises:
        a) an input for a search input signal;
        b) an output for a match signal;
        c) a first storage cell for holding either a first value or a second value;
        d) a second storage cell for holding either a third value or a fourth value; and
        e) match logic, with the first storage cell coupled at a first storage cell output as a first input to the match logic, with the second storage cell coupled at a second storage cell output as a second input to the match logic,
    wherein the match logic comprises a first tristate gate with a first tristate input for receiving the search input signal, a first tristate output coupled to the output for the match signal, a first gate input coupled to the first storage cell output that gates the search input signal from the first tristate input to the output for the match signal when the first storage cell holds the second value otherwise does not gate the first tristate input to the output for the match signal and a second tristate gate with a second tristate input for receiving an inverse of the search input signal, a second tristate output coupled to the output for the match signal, a second gate input coupled to the second storage cell output that gates the inverse of the search input signal from the second tristate input to the output for the match signal when the second storage cell holds the fourth value otherwise does not gate the second tristate input to the output for the match signal, and
    wherein the output for the match signal indicates a match when (a) the first storage cell holds the first value, the second storage cell holds the fourth value and the search input signal is a logical low signal, (b) the first storage cell holds the second value, the second storage cell holds the third value and the search input signal is a logical high signal, or (c) regardless of the search input signal, the first storage cell holds the first value and the second storage cell holds the third value.

2. The ternary content addressable memory of claim 1, wherein the first tristate gate comprises a first NMOS/PMOS transistor pair and/or the second tristate gate comprises a second NMOS/PMOS transistor pair.

3. The ternary content addressable memory of claim 1, wherein the first tristate gate comprises a first NMOS transistor or a first PMOS transistor and/or the second tristate gate comprises a second NMOS transistor or a second PMOS transistor.

4. The ternary content addressable memory of claim 1, further comprising:
    combining logic for combining outputs of match logic of each TCAM cell of the TCAM cells of a row of the rows of TCAM cells; and
    an output for the combining logic that indicates whether the TCAM cells of the row match the plurality of search inputs.

5. The ternary content addressable memory of claim 4, wherein the combining logic comprises a first row of gates and a second row of gates, wherein the first row of gates comprises NAND gates and the second row of gates comprises NOR gates or wherein the first row of gates comprises NOR gates and the second row of gates comprises NAND gates.

6. The ternary content addressable memory of claim 5, wherein each gate of the first row of gates has two, three, or four logic inputs from TCAM cell match logic outputs.

7. The ternary content addressable memory of claim 1, wherein the plurality of search inputs is buffered to reduce RC delay.

8. The ternary content addressable memory of claim 1, wherein the plurality of search inputs is buffered to reduce RC delay using inverting gates.

9. A ternary content addressable memory TCAM cell comprising:
    a first input for a search input signal;
    a second input for a first TCAM cell memory signal, wherein the first TCAM cell memory signal represents a first value or a second value;
    a third input for a second TCAM cell memory signal, wherein the second TCAM cell memory signal represents a third value or a fourth value;
    an output for providing a signal of a match output line;
    a first tristate gate having a first tristate input for receiving the search input signal, a first tristate output coupled to the match output line, and a first tristate gate input for receiving the first TCAM cell memory signal such that the first TCAM cell memory signal gates the first tristate input to the first tristate output when the first TCAM cell memory signal represents the second value, otherwise does not gate the first tristate input to the first tristate output;
    a second tristate gate having a second tristate input for receiving an inverse of the search input signal, a second tristate output coupled to the match output line, and a second tristate gate input for receiving the second TCAM cell memory signal such that the second TCAM cell memory signal gates the second tristate input to the second tristate output when the second TCAM cell memory signal represents the fourth value, otherwise does not gate the second tristate input to the second tristate output; and a first MOS transistor and a second MOS transistor coupled in series between the match output line and a logical line, with a first MOS gate input of the first MOS transistor coupled to receive the first TCAM cell memory signal and a second MOS gate input of the second MOS transistor coupled to receive the second TCAM cell memory signal, wherein the first MOS transistor is on when the first TCAM cell memory signal represents the first value and off when the first TCAM cell memory signal represents the second value, and wherein the second MOS transistor is on when the second TCAM cell memory signal represents the third value and off when the second TCAM cell memory signal represents the fourth value.

10. The ternary content addressable memory TCAM cell of claim 9, wherein the first value and the third value are logical low voltages, the second value and the fourth value are logical high voltages, the first MOS transistor and the second MOS transistor are PMOS transistors, and wherein the logical line is a logical high line.

11. The ternary content addressable memory TCAM cell of claim 10, wherein the logical high line is coupled to a supply line.

12. The ternary content addressable memory TCAM cell of claim 9, wherein the first value and the third value are logical high voltages, the second value and the fourth value are logical low voltages, the first MOS transistor and the second MOS transistor are NMOS transistors, and wherein the logical line is a logical low line.

13. The ternary content addressable memory TCAM cell of claim 9, wherein the first value is a logical low voltage, the second value is a logical high voltage, and wherein the first tristate gate comprises a PMOS transistor and an NMOS transistor, with a gate of the PMOS transistor coupled to an inverse of the first TCAM cell memory signal and a gate of the NMOS transistor coupled to the first TCAM cell memory signal.

14. The ternary content addressable memory TCAM cell of claim 9, wherein the first value is a logical low voltage, the second value is a logical high voltage, and wherein the first tristate gate comprises an NMOS transistor with a gate coupled to the first TCAM CAM cell memory signal.

15. The ternary content addressable memory (TCAM) cell of claim 9, wherein the third value is a logical low voltage, the fourth value is a logical high voltage, and wherein the second tristate gate comprises a PMOS transistor and an NMOS transistor, with a gate of the PMOS transistor coupled to an inverse of the second TCAM cell memory signal and a gate of the NMOS transistor coupled to the second TCAM cell memory signal.

16. The ternary content addressable memory (TCAM) cell of claim 9, wherein the third value is a logical low voltage, the fourth value is a logical high voltage, and wherein the second tristate gate comprises an NMOS transistor with a gate coupled to the second TCAM cell memory signal.

\* \* \* \* \*